United States Patent [19]

Akai

[11] Patent Number: 4,914,301
[45] Date of Patent: Apr. 3, 1990

[54] X-RAY DETECTOR

[75] Inventor: Yoshimi Akai, Yaita, Japan

[73] Assignee: Kabushiki Kaisha Toshiba, Kawasaki, Japan

[21] Appl. No.: 182,233

[22] Filed: Apr. 15, 1988

[30] Foreign Application Priority Data

Apr. 21, 1987 [JP] Japan .................................. 62-96184
Aug. 6, 1987 [JP] Japan .................................. 62-198812

[51] Int. Cl.$^4$ .......................... G01T 1/24; H01L 27/14
[52] U.S. Cl. ........................ 250/370.01; 250/370.04; 250/370.11; 357/30
[58] Field of Search .................... 250/370.01, 370.04, 250/370.06, 370.07, 370.09, 370.10, 370.11, 370.12, 370.14; 357/63, 29, 30 H

[56] References Cited

U.S. PATENT DOCUMENTS 4,234,792 11/1980 Decou et al. ..................... 250/366
4,472,728 9/1984 Grant et al. ..................... 250/370.06
4,694,177 9/1987 Akai .............................. 250/370.09

FOREIGN PATENT DOCUMENTS

3438441A1 5/1985 Fed. Rep. of Germany .
3513196A1 10/1985 Fed. Rep. of Germany .
62-63880 3/1987 Japan .
62-76478 4/1987 Japan .

Primary Examiner—Constantine Hannaher
Assistant Examiner—J. Eisenberg
Attorney, Agent, or Firm—Finnegan, Henderson, Farabow, Garrett & Dunner

[57] ABSTRACT

In an X-ray detecting device, a plurality of scintillator elements are arranged and assembled in a array which is located on a semiconductor structure. In a semiconductor structure, a plurality of photo-detecting structures are formed in a substrate and are arranged in an array corresponding to the scintillator element array. A trap region is formed in an intermediate region of the substrate surface between the adjacent photo-detecting structures so that an electrical signal which is produced in the intermediate region by light rays generated in the scintillator element is trapped in the trapped region.

24 Claims, 2 Drawing Sheets

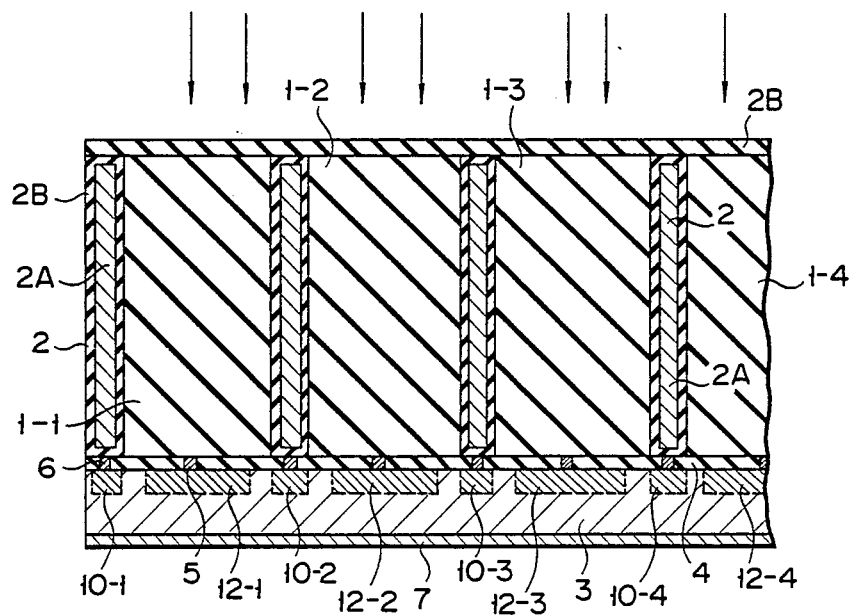
F I G. 1
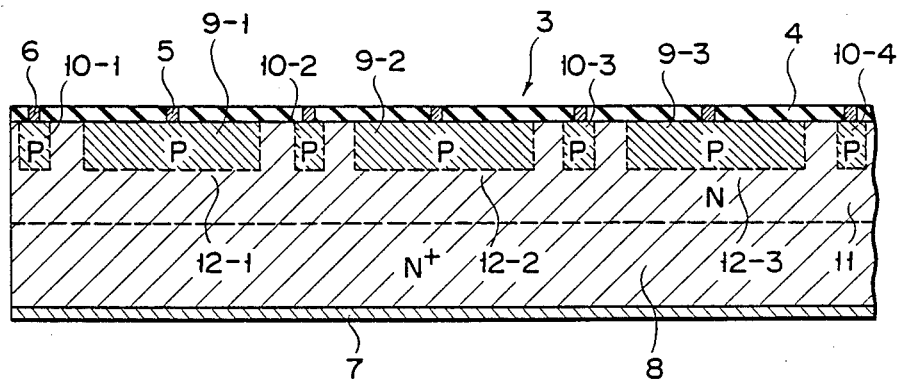
F I G. 2

X-RAY DETECTOR

BACKGROUND OF THE INVENTION

1. Field of the Invention

The present invention relates to an X-ray detector for converting X-rays into an electric signal and, more particularly, to an X-ray detector, incorporated in an X-ray computed tomography scanner, for detecting X-rays.

2. Description of the Related Art

In an X-ray computed tomography scanner of the third or fourth generation, an X-ray detector in which a plurality of X-ray detecting elements are arranged in an arcuated shape is used and X-rays passing through a region of interest are detected by the X-ray detecting elements. Recently, such a detecting element is manufactured by combining a scintillator element and a photo-detecting element as disclosed in U.S. Pat. No. 4,234,792. X-rays incident on the scintillator element are converted into light rays by the scintillator element, and the converted light rays are converted into an electric signal by the photo-detecting element fixed to the scintillator element.

An X-ray detector for an X-ray computed tomography scanner comprises a large number of X-ray detecting elements each consisting of a photo-detecting semiconductor structure and a scintillator element. A large number of photo-detecting semiconductor structures are arranged in an array on a single chip cut out from a wafer. A large number of scintillator elements are similarly arranged in an array, and this array of scintillator elements is mounted on the single chip so that each scintillator element is aligned with a corresponding one of the photo-detecting structures. In such an X-ray detector, a width of each photo-detecting structure in an array direction of the structures is set substantially equal to or slightly smaller than that of each scintillator element in the same array direction. Therefore, if a small alignment error is produced due to a manufacturing error or an adverse affect of thermal expansion during manufacture, a semiconductor region between the adjacent photo-detecting structures is brought into contact with the lower surface of each scintillator element. In this case, light rays generated in each scintillator element are incident on the semiconductor region and are converted into electric charge in the semiconductor region. These electric charges may be disadvantageously diffused and supplied to an adjacent photo-detecting structure as noise. As a result, a signal component generated in a scintillator element not corresponding to a photo-detecting structure into which the electric charges are flowing is detected by a photo-detecting structure, and crosstalk is generated between adjacent X-ray detecting elements each consisting of a photo-detecting structure and a scintillator element.

The X-ray detector for an X-ray computed tomography scanner is normally constituted by 512 X-ray detecting elements. In general, the detector is manufactured by assembling 32 units each consisting of 16 X-ray detecting elements. As described above, a chip of each unit on which the photo-detecting structure array is formed is cut out from a wafer. Therefore, a signal current, i.e., a dark current may be generated in a photo-detecting structure adjacent to a cutting side of each chip without incidence of light rays. This is because in the cutout chip, when defects are produced in a semiconductor crystal structure of the cutting side and an operation voltage is applied to a photo-detecting structure, a dark current is generated in this region and flowed into a photo-detecting structure adjacent to the cutting side as noise.

SUMMARY OF THE INVENTION

It is an object of the present invention to provide an X-ray detecting unit having a structure which can significantly reduce or prevent generation of noise.

According to an aspect of the present invention, there is provided an X-ray detecting device comprising:

a plurality of elements, each for converting incident X-rays into light rays, having a surface from which the light rays emerge, the elements being arranged in an array;

a semiconductor structure having one surface, the semiconductor structure having a plurality of semiconductor light detecting regions, formed in the surface of the semiconductor structure, for receiving light rays emerging from the light ray emerging surface and converting the light rays into an electric signal, the semiconductor light detecting regions being arranged to be spaced from each other in an array on the surface of the semiconductor structure in correspondence to the array of the converting elements, and a plurality of trap regions, each formed in an intermediate region of a first surface between the adjacent semiconductor light detecting regions, for trapping an electrical signal generated by light rays incident on the intermediate region of the first surface between the adjacent semiconductor light detecting regions;

first electrode means, formed on the semiconductor structure, for outputting an electrical signal from the plurality of semiconductor light detecting regions; and second electrode means, formed on the semiconductor structure, for extracting the electrical signal trapped in the plurality of trap regions.

According to another aspect of the present invention, there is provided an X-ray detecting device comprising:

a plurality of elements, each for converting incident X-rays into light rays, having a surface from which the light rays emerge, the elements being arranged in an array;

a semiconductor structure having one surface, the semiconductor structure having a plurality of semiconductor light detecting regions, formed in the surface of the semiconductor structure, for receiving light rays emerging from the light ray emerging surface and converting the light rays into an electric signal, the semiconductor light detecting regions being arranged to be spaced from each other in an array on the surface of the semiconductor structure in correspondence to the array of the converting elements;

a plurality of layers, each formed on an intermediate region of a first surface between the adjacent semiconductor light detecting regions, for shielding light rays propagating toward the intermediate region of the first surface between the adjacent semiconductor light detecting regions; and electrode means, formed on the semiconductor structure, for outputting an electrical signal from the plurality of semiconductor light detecting regions.

According to still another aspect of the present invention, there is provided an X-ray detecting device comprising:

a plurality of elements, each for converting incident X-rays into light rays, having a surface from which the light rays emerge, the elements being arranged in an array;

a semiconductor structure having one surface, the semiconductor structure having a plurality of semiconductor light detecting regions, formed in the surface of the semiconductor structure, for receiving light rays emerging from the light ray emerging surface and converting the light rays into an electric signal, the semiconductor light detecting regions being arranged to be spaced from each other in an array on the surface of the semiconductor structure in correspondence to the array of the converting elements, and a plurality of defective regions, each formed in an intermediate region of a first surface between the adjacent semiconductor light detecting regions, for recombining hole-electron pairs generated by light rays incident on the intermediate region of the first surface between the adjacent semiconductor light detecting regions;

electrode means, formed on the semiconductor structure, for outputting an electrical signal from the plurality of semiconductor light detecting regions.

BRIEF DESCRIPTION OF THE DRAWINGS

FIG. 1 is a schematic sectional view showing an X-ray detecting device according to an embodiment of the present invention;

FIG. 2 is a schematic sectional view of the semiconductor device shown in FIG. 1;

DETAILED DESCRIPTION OF THE PREFERRED EMBODIMENTS

Figure 3:
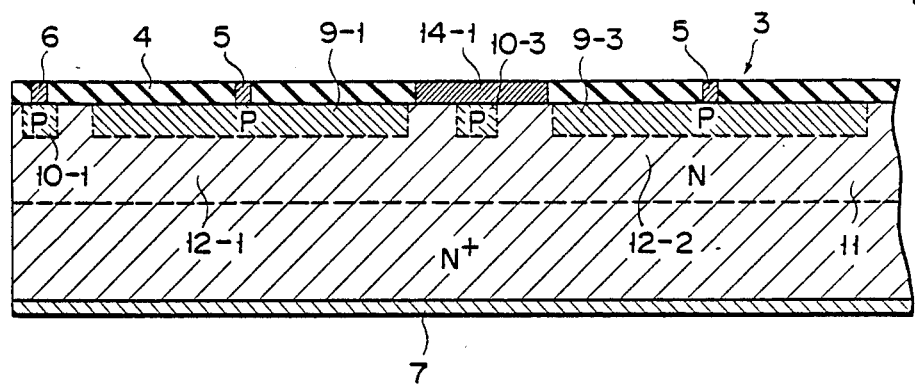
FIG. 3 is a schematic sectional view of a modification of the semiconductor device shown in FIG. 2.

As shown in FIG. 1, a plurality of scintillator elements 1-1 to 1-n, e.g., 12, each for converting incident X-rays into light rays, are arranged in an array through spacers 2. In each spacer 2, a light reflecting member which transmits X-rays and reflects visible light rays is coated on the surface of thin plate 2A normally consisting of a heavy metal having a high X-ray absorption index such as lead or tungsten, thereby forming light reflecting layer 2B. Similarly, light reflecting layer 2B which transmits X-rays and reflects visible light rays is formed on the X-ray incident surfaces of scintillator elements 1-1 to 1-n. The array of scintillator elements 1-1 to 1-n is fixed to semiconductor device 3 (shown in FIG. 2 in an enlarged scale) through transparent adhesive layer 4. Semiconductor device 3 has electrode arrays 5 and 6 on its one surface and ground electrode 7 on the other surface. The lower surfaces of scintillator elements 1-1 to 1-n face semiconductor device 3. A plurality of photo-detecting structures, e.g., 16, such as p-n junction structures 12-1 to 12-16 are formed in an array on semiconductor device 3. That is, an N+-type impurity is diffused from one surface of a semiconductor chip to form N+-type layer 8, and a P+-type impurity is selectively diffused from the other surface of the semiconductor chip into N-type substrate region 11 to form P+-type regions 9-1 to 9-n. Similarly, the P+-type impurity is also selectively diffused into semiconductor intermediate regions between adjacent ones of P+-type regions 9-1 to 9-n to form channel stopper regions 10-1 to 10-n. Therefore, p-n junction photo-detecting structures 12-1 to 12-n are formed on the semiconductor chip by semiconductor substrate region 11 of N-type and P+-type impurity regions 9-1 to 9-n.

Al electrodes 5 and 6 are formed on P+-type impurity regions 9-1 to 9-n and channel stopper regions 10-1 to 10-n between adjacent ones of the regions 9-1 to 9-n, and each of scintillator elements 1-1 to 1-n is arranged on a corresponding one of P+-type impurity regions 9-1 to 9-n through electrodes 5 and 6 and the transparent adhesive layer formed on one surface of the semiconductor chip. The array of scintillator elements 1-1 to 1-n is fixed so that each spacer 2 is arranged on one of channel stopper regions 10-1 to 10-n. Ground electrode 7 is deposited on the other surface of the semiconductor chip and is reliably kept in ohmic contact with the semiconductor chip by N+-type layer 8. A plurality of X-ray detecting devices, e.g., 32, each formed on the semiconductor chip are arranged in an arcuated shape, thereby manufacturing an X-ray detecting apparatus.

In the X-ray detecting device shown in FIGS. 1 and 2, electrodes 6 are maintained at the ground potential to be capable of detecting X-rays when electrodes 5 are maintained at an operation potential. When X-rays are incident on scintillator elements 1-1 to 1-n, the X-rays are converted into light rays in scintillator elements 1-1 to 1-n. The converted light rays are incident on p-n junction photo-detecting structures 12-1 to 12-n directly or after being reflected by light reflecting layer 2B, converted into an electric signal, and then detected by electrodes 5.

In the X-ray detecting device shown in FIGS. 1 and 2, a width of each of P+-type regions 9-1 to 9-n in an array direction is set slightly smaller than or substantially equal to that of a light emerging surface of each of scintillator elements 1-1 to 1-n. Therefore, even if an array of scintillator elements 1-1 to 1-n is slightly misaligned with an array of p-n junction structures 12-1 to 12-16 on semiconductor device 3 due to a small error produced upon manufacture, the semiconductor regions between P+-type regions 9-1 to 9-n are caused to oppose the light emerging surfaces of scintillator elements 1-1 to 1-n. As a result, light rays generated in scintillator elements 1-1 to 1-n are incident on the semiconductor regions between P+-type regions 9-1 to 9-n through the light emerging surfaces, and an electric signal is generated in semiconductor region 11. For example, light rays generated in scintillator element 1-2 are incident on the semiconductor region between P+-type regions 9-1 and 9-2 through the light emerging surface, and an electric signal is generated in semiconductor region 11. When the electric signal generated in semiconductor region 11 is trapped in photo-detecting structure 12-2, light rays generated in scintillator element 1-2 corresponding to photo-detecting structure 12-2 are output from photo-detecting structure 12-2. Therefore, no crosstalk, i.e., noise, is generated. However, when the electric charge generated in semiconductor 11 is trapped in photo-detecting structure 12-1, light rays generated in scintillator element 1-2 not corresponding to photo-detecting structure 12-1 are output from photo-detecting structure 12-1. Therefore, crosstalk is generated between photo-detecting structures 12-1 and 12-2. In the X-ray detecting device shown in FIGS. 1 and 2, each of P+-type channel stoppers 10-1 to 10-n is formed in a corresponding one of semiconductor regions between P+-type regions 9-1 to 9-n and maintained at the ground potential by electrode 6. For this reason, an electric signal generated in semiconductor region 11 by light rays from scintillator elements 1-2 is trapped not in photo-detecting structure 12-1 not corresponding to scintillator element 1-2 but in channel stopper 10-2. Therefore, no crosstalk is generated between photo-detecting structures 12-1 and 12-2.

As shown in FIGS. 1 and 2, P+-type channel stopper 10-1 is formed adjacent to the cutting side of the semiconductor chip in semiconductor region 11. Therefore, when a dark current is generated in the cutting side of the semiconductor chip while an operation voltage is applied between electrodes 7 and 5, this dark current is trapped in P+-type channel stopper 10-1 and hence is not flowed into photo-detecting structure 12-1 as noise.

FIG. 3 shows a modification of the embodiment shown in FIGS. 1 and 2. In FIG. 3, light shielding films 14-1 to 14-n, each formed by depositing a material which prevents incidence of light rays on the semiconductor region, e.g., aluminum Al or silicon nitride SiN on a corresponding one of semiconductor regions between P+-type regions 9-1 and 9-n are provided on the semiconductor regions between P+-type regions 9-1 to 9-n. When P+-type channel stoppers 10-1 to 10-n are formed in a semiconductor region below light shielding films 14-1 to 14-n as shown in FIG. 3, light shielding films 14-1 to 14-n may also serve as an electrode which is maintained at the ground potential.

In the X-ray detecting device shown in FIG. 3, X-rays incident on scintillator elements 1-1 to 1-n are converted into light rays in scintillator elements 1-1 to 1-n. If the converted light rays propagate toward the semiconductor regions between p-n junction photo-detecting structures 12-1 to 12-n, the light rays are prevented from propagating toward the semiconductor region below light shielding films 14-1 to 14-n by light shielding films 14-1 to 14-n. If some of the light rays are incident on the semiconductor regions between p-n junction photo-detecting structures 12-1 to 12-n and converted into an electric signal in semiconductor region 11, an electric charge of the signal is trapped in P+-type channel stoppers 10-1 to 10-n below light shielding films 14-1 and 14-n. Therefore, no crosstalk is generated between adjacent p-n junction photo-detecting structures 12-1 to 12-n.

Figure 4:
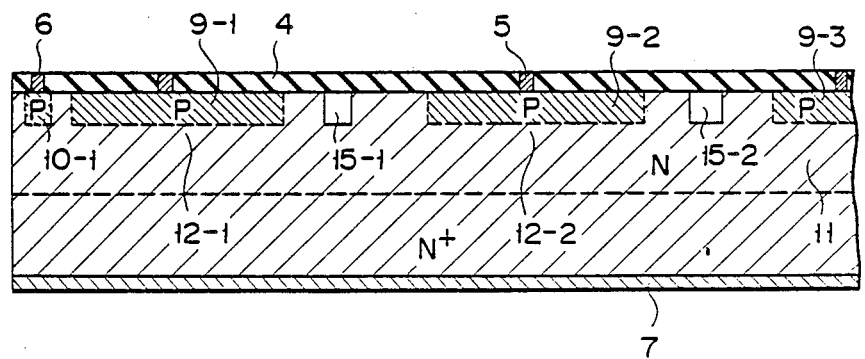
FIG. 4 is a schematic sectional view of a modification of the semiconductor device shown in FIG. 2.

As shown in FIG. 4, cutting grooves 15-1 to 15-n may be formed in semiconductor regions between P+-type regions 9-1 to 9-n instead of P+-type channel stoppers 10-1 to 10-n. When such cutting grooves 15-1 to 15-n are formed, defects are produced in a crystal structure due to mechanical distortion in the semiconductor regions in which cutting grooves 15-1 to 15-n are formed, and an electric charge diffusion constant of the regions is sufficiently reduced. Therefore, if light rays are incident on semiconductor region 11 in which cutting grooves 15-1 to 15-n are formed and hole-electron pairs are generated, recombination is promoted in the defective region and the hole-electron pairs generated in the defective region are prevented from being trapped in p-n junction photo-detecting structures 12-1 to 12-n. As a result, no crosstalk is generated between adjacent p-n junction photo-detecting structures 12-1 to 12-n.

In the above embodiment, a P-type impurity region is formed in an N-type semiconductor to form a p-n junction photo-detecting structure. However, the present invention can be applied when an N-type impurity region is formed in a P-type semiconductor to form a p-n junction photo-detecting structure.

What is claimed is:

1. An X-ray detecting device comprising:
   a plurality of converting elements for converting incident X-rays into light rays, each of the converting elements having a first surface from which the light rays emerge, said converting elements being arranged in an array;
   a semiconductor structure having a second surface, said semiconductor structure including a plurality of semiconductor light detecting regions formed in the second surface and spaced from one another to form a corresponding plurality of intermediate regions in the second surface between the respective detecting regions, each of the detecting regions being positioned substantially adjacent to a corresponding one of the converting elements to receive light rays emerging from the first surface of that converting element and convert the light rays into an electrical signal, said semiconductor structure further including a plurality of trap regions formed in respective ones of the intermediate regions of the second surface for substantially confining the electrical signals to the respective detecting regions;
   first electrode means, formed on said semiconductor structure and coupled to the detecting regions, for outputting the electrical signals from the respective detecting regions; and
   second electrode means, formed on said semiconductor structure and coupled to the trap regions, for controlling the electrical potential of the trap regions.

2. A device according to claim 1, further comprising a plurality of layers, each of the layers being formed on a corresponding one of the intermediate regions for shielding the corresponding intermediate layer from light rays.

3. A device according to claim 1, further comprising a plurality of spacers, each of the spacers being positioned between adjacent ones of the converting elements.

4. A device according to claim 1, wherein each of the converting elements includes a plurality of reflective surfaces, said reflective surfaces being coated with a light reflecting layer for reflecting light rays generated by that converting element.

5. A device according to claim 1, wherein said semiconductor structure is formed in a semiconductor chip having an edge, and the semiconductor structure includes a plurality of trap regions formed in the second surface between the edge and corresponding ones of the detecting regions adjacent to the edge to substantially confine the electrical signals to the corresponding detecting regions.

6. A device according to claim 1, wherein said semiconductor structure includes a semiconductor substrate of a first conductivity type that includes the second surface, and the detecting regions are of a second conductivity type that is opposite the first conductivity type.

7. A device according to claim 6, wherein said trap regions are of the second conductivity type.

8. A device according to claim 1, wherein each of the detecting regions has a width along the second surface, each of the converting elements has a corresponding width along the first surface, and the width of the detecting regions is smaller than the width of the converting elements.

9. An X-ray detecting device comprising:
   a plurality of converting elements for converting incident X-rays into light rays, each of the converting elements having a first surface from which the light rays emerge, said converting elements being arranged in an array;

a semiconductor structure having a second surface, said semiconductor structure including a plurality of semiconductor light detecting regions formed in the second surface and spaced from one another to form a corresponding plurality of intermediate regions in the second surface between the respective detecting regions, each of the detecting regions being positioned substantially adjacent to a corresponding one of the converting elements to receive light rays emerging from the first surface of that converting element and convert the light rays into an electrical signal,;

a plurality of layers formed on respective ones of the intermediate regions for shielding the corresponding intermediate region from light rays; and electrode means, formed on said semiconductor structure and coupled to the detecting regions, for outputting the electrical signals from the respective detecting regions.

10. A device according to claim 9, further comprising a plurality of spacers, each of the spacers being positioned between adjacent ones of the converting elements.

11. A device according to claim 9, wherein each of the converting elements includes a plurality of reflective surfaces, said reflective surfaces being coated with a light reflecting layer for reflecting light rays generated by that converting element.

12. A device according to claim 9, wherein said semiconductor structure is formed in a semiconductor chip having an edge, and the semiconductor structure includes a plurality of trap regions formed in the second surface between the edge and corresponding ones of the detecting regions adjacent to the edge to substantially confine the electrical signals to the respective detecting regions.

13. A device according to claim 9, wherein said semiconductor structure includes a semiconductor substrate of a first conductivity type that includes the second surface, and the detecting regions are of a conductivity type that is opposite the first conductivity type.

14. A device according to claim 13, further comprising a plurality of trap regions formed in respective ones of the intermediate regions of the second surface for substantially confining the electrical signals to the respective detecting regions.

15. A device according to claim 9, wherein each of the detecting regions has a width along the second surface, each of the converting elements has a corresponding width along the first surface, and the width of the detecting regions is smaller than the width of the converting elements.

16. An X-ray detecting device comprising:

a plurality of converting elements for converting incident X-rays into light rays, each of the converting elements having a first surface from which the light rays emerge, said converting elements being arranged in an array;

a semiconductor structure having a second surface, said semiconductor structure including a plurality of semiconductor light detecting regions formed in the second surface and spaced from one another to form a corresponding plurality of intermediate regions in the second surface between the respective detecting regions, each of the detecting regions being positioned substantially adjacent to a corresponding one of the converting elements to receive light rays emerging from the first surface of that converting element and convert the light rays into an electrical signal, said semiconductor structure further including a plurality of defect regions formed in respective ones of the intermediate regions for recombining hole-electron pairs generated by light rays incident on a corresponding one of the intermediate regions; and electrode means, formed on said semiconductor structure and coupled to the detecting regions, for outputting the electrical signals from the respective detecting regions.

17. A device according to claim 16, wherein each of said defective regions includes a groove cut in the corresponding one of the intermediate regions.

18. A device according to claim 16, further comprising a plurality of layers formed on respective ones of the regions for shielding the corresponding intermediate region from light rays.

19. A device according to claim 16, further comprising a plurality of spacers, each of the spacers being positioned between adjacent ones of the converting elements.

20. A device according to claim 16, wherein each of the converting elements includes a plurality of reflective surfaces, said reflective surfaces being coated with a light reflecting layer for reflecting light rays generated by that converting element.

21. A device according to claim 16, wherein said semiconductor structure is formed on a semiconductor chip having an edge, and the semiconductor structure includes a plurality of trap regions formed in the second surface between the edge and corresponding ones of the detecting regions adjacent to the edge to substantially confine the electrical signals to the respective detecting regions.

22. A device according to claim 16, wherein said semiconductor structure includes a semiconductor substrate of a first conductivity type that includes the second surface, and the detecting regions are of a conductivity type that is opposite the first conductivity type.

23. A device according to claim 22, further comprising a plurality of trap regions formed in respective ones of the intermediate regions of the second surface for substantially confining the electrical signals to the respective detecting regions.

24. An X-ray detecting device according to claim 16, wherein each of the detecting regions has a width along the second surface, each of the converting elements has a corresponding width along the first surface, and the width of the detecting regions is smaller than the width of the converting elements.

* * * * *

UNITED STATES PATENT AND TRADEMARK OFFICE
CERTIFICATE OF CORRECTION

PATENT NO. : 4,914,301
DATED : April 03, 1990
INVENTOR(S) : Yoshimi Akai It is certified that error appears in the above-identified patent and that said Letters Patent is hereby corrected as shown below:

Claim 9, column 7, line 15, change "signal,;" to --signal;--.

Title Page:
Abstract, line 2, change "a" to --an--.

Signed and Sealed this

Twentieth Day of October, 1992

*Attest:*

DOUGLAS B. COMER

*Attesting Officer*     *Acting Commissioner of Patents and Trademarks*